United States Patent [19]
Hant

[11] Patent Number: 5,396,203
[45] Date of Patent: Mar. 7, 1995

[54] DEMOUNTABLE WIRE CAGE WAVEGUIDE FOR PERMITTIVITY MEASUREMENTS OF DIELECTRIC MATERIALS

[75] Inventor: William Hant, Los Angeles, Calif.

[73] Assignee: Northrop Grumman Corporation, Los Angeles, Calif.

[21] Appl. No.: 32,944

[22] Filed: Mar. 17, 1993

[51] Int. Cl.$^6$ .................. H01P 5/00; H01P 3/12; G01R 31/12
[52] U.S. Cl. .................. 333/248; 333/254; 324/639
[58] Field of Search .......... 333/239, 248, 254; 324/632, 637, 639, 642

[56] References Cited

U.S. PATENT DOCUMENTS

| | | | |
|---|---|---|---|
| 2,464,269 | 3/1949 | Smith | 343/911 R |
| 2,840,788 | 6/1958 | Mullett et al. | 333/248 X |
| 3,234,489 | 2/1966 | Hahne | 333/239 |
| 3,337,822 | 8/1967 | Hahne | 333/239 |
| 3,474,354 | 10/1969 | Simon | 333/22 R |
| 3,537,043 | 10/1970 | Smith | 333/239 |
| 3,560,695 | 2/1971 | Williams et al. | 219/10.55 |
| 3,577,105 | 5/1971 | Jones, Jr. | 333/254 X |
| 3,771,077 | 11/1973 | Tischer | 333/239 |
| 3,801,939 | 4/1974 | Lamy et al. | 333/239 |
| 3,944,326 | 3/1976 | Tacke et al. | 333/239 X |
| 4,862,186 | 8/1989 | Strider | 343/776 |
| 4,918,411 | 4/1990 | Staehlin et al. | 333/239 |

Primary Examiner—Benny T. Lee
Attorney, Agent, or Firm—Terry J. Anderson; Karl Hoch, Jr.

[57] ABSTRACT

A fixture for determining RF characteristics of a dielectric medium comprises a first coupler having an RF through-window with input and output ports, the input port connectable to a waveguide input. A second coupler has an RF through-window with input and output ports, the output port connectable to an output waveguide. A plurality of rods are aligned with the axes of the input and output waveguides and connect the output port of the first coupler to the input port of the second coupler. Each rod is passable through the dielectric media and mates with the input port so as to form a continuous waveguide passing through the dielectric media.

14 Claims, 2 Drawing Sheets

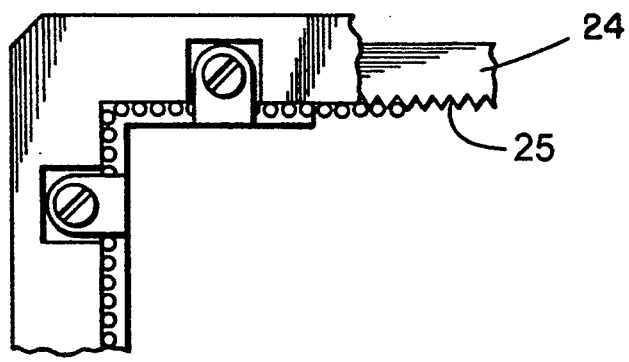
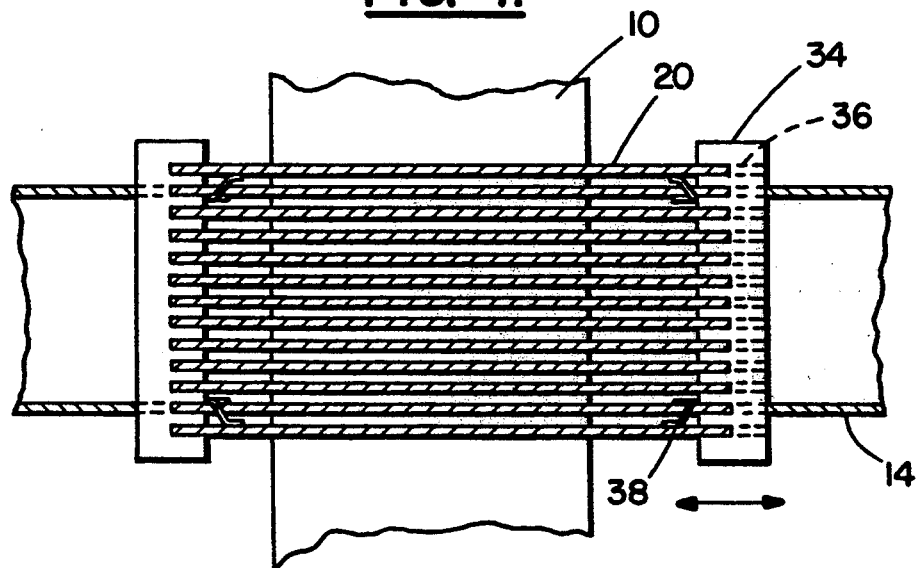
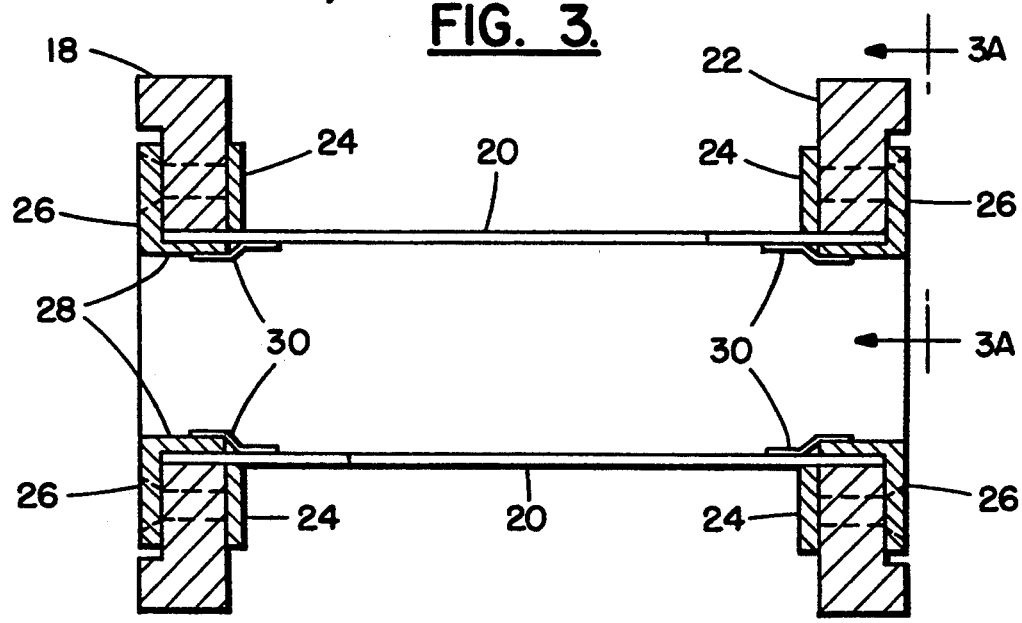

DEMOUNTABLE WIRE CAGE WAVEGUIDE FOR PERMITTIVITY MEASUREMENTS OF DIELECTRIC MATERIALS

The U.S. Government has a paid-up license in this invention and the right in limited circumstances to require the patent owner to license others on reasonable terms as provided for by the terms of contract F33615-81-C-0067 awarded by the United States Air Force.

FIELD OF THE INVENTION

This invention relates generally to waveguide structures, and more particularly, to a waveguide structure particularly adapted to making permittivity measurements of honeycomb dielectrics.

BACKGROUND OF THE INVENTION

Dielectric honeycomb core materials see a variety of uses in microwave applications. Such honeycomb materials are used to provide loading within waveguides and to provide structural supports for high frequency components. In certain applications, it is required that the permittivity of the honeycomb material be known precisely. Since permittivity values of honeycomb core can vary over a substantial range, it is desirable to test the permittivity of the core structure prior to its actual use. In such a test, the permittivity is measured of different sections of a large core block, before the block is machined and parts installed. Clearly, any testing of the honeycomb core should be non-destructive, be accomplished rapidly, and provide accurate results.

The prior art illustrates a variety of applications of dielectric core structures and their application to waveguide systems, but does not indicate a method for rapid non-destructive testing of honeycomb material. U.S. Pat. No. 2,840,788 to Mullett, et al discloses the use of various shaped dielectric structures to provide internal waveguide loads. U.S. Pat. Nos. 3,234,489 and 3,337,822, both to Hahne, describe various applications of cellular supporting dielectric structures that are used to provide physical support for metallic waveguides. U.S. Pat. No. 3,771,077 to Tischer describes the use of metal posts that are mounted on a dielectric surface to provide a segmented waveguide structure. U.S. Pat. 3,474,354 to Simon discloses the use of transverse metal rods as loads in a waveguide structure. The rods are mounted transversely to the direction of wave propagation and thereby provide a loading effect within the waveguide. U.S. Pat. No. 3,560,695 to Williams, et al. also discloses the use of conductive rods for reactively loading a flat waveguide structure. U.S. Pat. 3,944,326 to Tacke, et al. discloses the use of a segmented grating as a waveguide structure.

U.S. Pat. No. 2,464,269 to Smith discloses the use of dielectric posts for polarization control in a waveguide. U.S. Pat. Nos. 3,801,939 to Lamy, et al. and 4,862,186 to Strider both disclose segmented waveguide structures wherein subcomponents mount together to provide an overall waveguide arrangement.

As above indicated, waveguides with dielectric inserts are found in a number of applications. For example, multi-layer dielectric structures are used in phased array antenna systems to form the aperture assembly for each phase control module mounted in the antenna face. Such structures require an RF conduit embedded in the dielectric structure. U.S. Pat. No. 4,918,411 to Staeblin et al. shows such a structure with a grid-like waveguide assembly embedded in laminarly-assembled dielectric layers. The grid-like structure defines a waveguide and provides an RF signal transmission path through the layers of dielectric material positioned within the interior of the grid-like structure. The grid-like structure is not readily removable from the dielectric as it is embedded and integral therewith.

Accordingly, it is an object of this invention to provide a demountable waveguide structure particularly adapted to rendering of permittivity tests on a honeycomb dielectric.

It is another object of this invention to provide a demountable waveguide structure that may be rapidly assembled and disassembled and provides a non-destructive arrangement for making permittivity tests of a dielectric media.

SUMMARY OF THE INVENTION

A fixture for determining RF characteristics of a dielectric media comprises a first coupler having an RF through-window with input and output ports, the input port connectable to a waveguide input. A second coupler has an RF through-window with input and output ports, the output port connectable to an output waveguide. A plurality of rods are aligned with the axes of the input and output waveguides and connect the output port of the first coupler to the input port of the second coupler. Each rod is passable through the dielectric media and mates with the input port so as to form a continuous waveguide passing through the dielectric media.

DESCRIPTION OF THE DRAWINGS

FIG. 3 is a sectional view of input and output ports and connecting rods for a demountable waveguide structure embodying the invention.

FIG. 3a is a view of FIG. 3 taken along line 3A–3A.

FIG. 4 illustrates another embodiment of the invention.

DETAILED DESCRIPTION OF THE INVENTION

Figure 1:
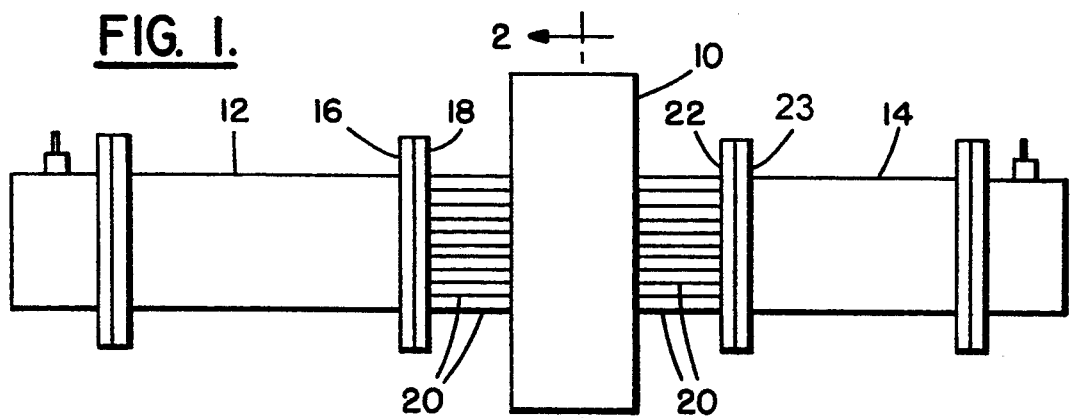
FIG. 1 is a side view of the invention.

Referring to FIG. 1, a honeycomb dielectric 10 is positioned between an input $TE_{10}$ waveguide structure 12 and an output $TE_{10}$ waveguide structure 14. Flange 16 on input waveguide 12 mates with an input flange 18 of a "squirrel cage" waveguide structure. The squirrel cage structure comprises a plurality of rods 20 that are arranged parallel to the direction of electromagnetic propagation within waveguides 12 and 14. Rods 20 are fixedly mounted in flange 18, extend through honeycomb dielectric 10 and slidably engage output flange 22. Output flange 22 connects to flange 23 of output waveguide 14.

Figure 2A:
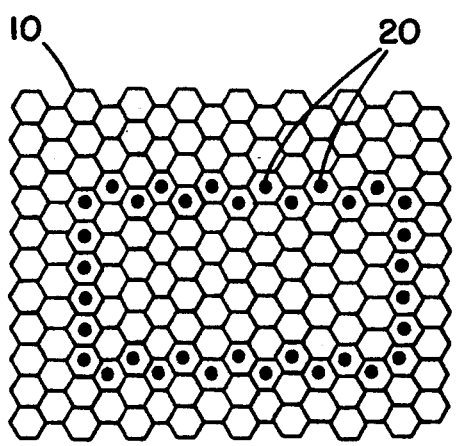
FIG. 2A is a section view of a dielectric core taken along line 2—2 in FIG. 1 with the core having a first orientation of cell structures.
Figure 2B:
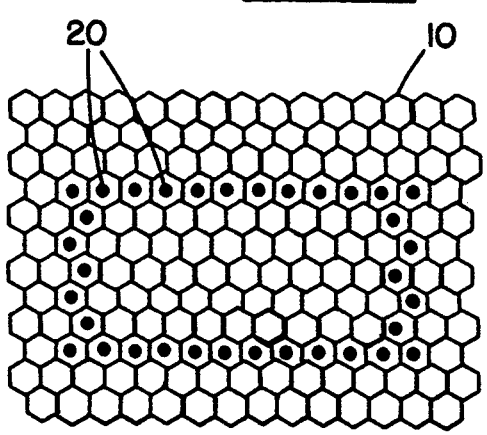
FIG. 2B is a section taken along line 2—2 in FIG. 1 with the honeycomb core having a second orientation of cell structures.
Figure 2C:
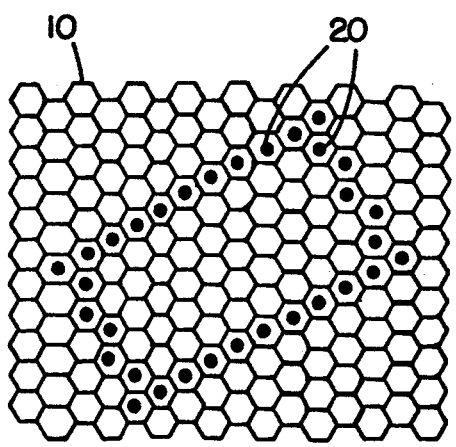
FIG. 2C indicates that honeycomb core can be tested at an intermediate angle.

In FIG. 2A, a section is shown of honeycomb dielectric 10, taken along line 2—2 in FIG. 1 (honeycomb dielectric 10 having a first core arrangement). Note that rods 20 are aligned with the core openings in honeycomb dielectric 10 so as to pass therethrough without damaging the interior of honeycomb dielectric 10. The top and bottom rods 20 form staggered rows, whereas the side rods form linear sides to mate with the core openings. By contrast, rods 20 in FIG. 2B are staggered along the upper and lower extremes and form staggered sides for the waveguide structure within the core openings in honeycomb dielectric 10. It will be understood by those skilled in the art that FIGS. 2A and 2B are schematic representations that show the hexagonal cells in expanded size. Typically, their cross-section is very much smaller than the waveguide dimension. Honeycomb core is usually anisotropic, thus permittivity measurements taken for the orientation of FIG. 2A will be different from the orientation shown in FIG. 2B. It is also possible to test honeycomb core at intermediate angles as shown in FIG. 2C where rods 20 of the waveguide structure are shown disposed in the core openings of honeycomb dielectric 10 at one such intermediate angle. From measurements of permittivity taken from two orientations (e.g., as in FIG. 2A and FIG. 2B, FIG. 2A and some intermediate angle, two different intermediate angles, etc.) it is possible analytically to determine the permittivities for all other angles.

In FIGS. 3 and 3A, details of the squirrel cage waveguide structure are shown with honeycomb dielectric, 10 removed (the side rods are not shown). Each flange 18 and 22 includes an inner plate 24 with a serrated inner edge 25 (see FIG. 3A) that provides an alignment function for each of rods 20. A rod support bracket 26 extends from a face of each of flanges 18 and 22 and, via an L-shaped portion 28, maintain rods 20 in place and in engagement with serrated inner edge 25. A foil "shorting bar" 30 provides an electrical shorting surface between rods 20 and the inner dimensions of L-shaped portions 28. Flanges 18 and 22 connect to flanges 16 and 23 (see FIG. 1) and provide a continuous waveguide feedthrough structure so that wavefronts appearing in input waveguide 12 are transmitted via adjacent flanges 16 and 18 to squirrel cage waveguide structure comprised of rods 20 and then through output flanges 22 and 23 to output waveguide 14.

In use, rod support bracket 26 is disconnected from flange 22 and flange 22 is removed from the ends of rods 20. A honeycomb dielectric 10 is then slipped over rods 20, assuring that each of rods 20 threads through a core cell. Then, flange 22 is slipped over the end of rods 20 and rod support bracket 26 is secured in place. By this means, a permittivity measurement may be taken of honeycomb dielectric 10 in a non-destructive manner with the waveguide feedthrough being easily mountable and demountable.

In FIG. 4, a further embodiment of the invention is shown wherein a moveable end flange 34 is substituted for flanges 18 and 22 in FIG. 1. In this case, flange 34 has a plurality of holes 36 which receive rods 20. By aligning rods 20 with holes 36, flange 34 can be slipped thereover and can be placed at any desired distance from honeycomb dielectric 10. To assure good electrical contact between waveguide 14 and rods 20, flexible contacts 38 are provided that slidably engage rods 20 and assure the provision of a continuous electrical surface between rods 20 and waveguide 14.

Figure 2D:
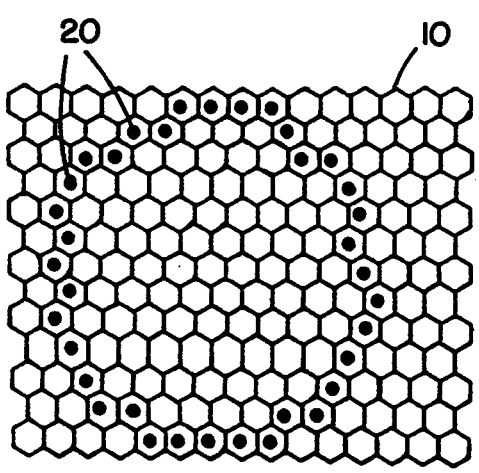
FIG. 2D indicates that honeycomb core can be tested using a circular waveguide structure.

It should be understood that the foregoing description is only illustrative of the invention. Various alternatives and modifications can be devised by those skilled in the art without departing from the invention. For instance, the demountable were cage arrangement is not limited to rectangular-waveguide sections, but also may be implemented for other cross sections (see FIG. 2D, where rods 20 of the waveguide structure are shown disposed in a generally circular cross section in the core openings of honeycomb dielectric 10 ). Accordingly, the present invention is intended to embrace all such alternatives, modifications and variances which fall within the scope of the appended claims.

I claim:

1. A fixture for determining RF characteristics of a dielectric medium, said fixture comprising:
an input waveguide;
a first coupler connected to said input waveguide, said first coupler having a first RF through-window with first input and output ports;
an output waveguide;
a second coupler connected to said output waveguide, said second coupler having a second RF through-window with second input and output ports; and,
a plurality of waveguide rod means for connecting said first output port of said first coupler to said second input port of said second coupler, each of said plurality of waveguide rod means being aligned parallel to a path of electromagnetic propagation between said input and output waveguides, said each of said plurality of waveguide rod means being inserted through a corresponding aperture of said dielectric medium and being removably connected to said second input port so as to define a demountable continuous waveguide structure passing through said dielectric medium and connecting said first output port of said first coupler to said second input port of said second coupler.

2. The fixture as recited in claim 1, wherein said each of said plurality of waveguide rod means is fixedly connected to said first output port of said first coupler and is slidably engaged with said second input port of said second coupler.

3. The fixture as recited in claim 2, wherein said second input port of said second coupler includes means for aligning said each of said plurality of waveguide rod means, said means for aligning being slidably engaged with said each of said plurality of waveguide rod means.

4. The fixture as recited in claim 3, further comprising:
flexible contact means respectively bridging between said plurality of waveguide rod means and a first inner periphery of said first output port of said first coupler and between said plurality of waveguide rod means and a second inner periphery of said second input port of said second coupler.

5. The fixture as recited in claim 3 wherein said each one of said plurality of waveguide rod means is positioned to define a rectangular waveguide section.

6. The fixture as recited in claim 5 wherein said first output port of said first coupler includes a plurality of bores therein for receiving respective ones of said plurality of waveguide rod means in slidable contact with walls of said bores, whereby alignment of said plurality of waveguide rod means is maintained.

7. The fixture as recited in claim 5 wherein said first output port of said first coupler includes:
an inner plate having a serrated inner edge for receiving said each one of said plurality of waveguide rod means in respective serrations of said inner edge; and, frame means for maintaining said each one said plurality of waveguide rod means in engagement with said respective serrations of said inner edge, whereby alignment of said plurality of waveguide rod means is maintained.

8. The fixture as recited in claim 5 wherein said second input port of said second coupler includes a plurality of bores therein for receiving respective ones of said plurality of waveguide rod means in slidable contact with walls of said bores, whereby alignment of said plurality of waveguide rod means is maintained.

9. The fixture as recited in claim 5 wherein said second input port of said second coupler includes:

an inner plate having a serrated inner edge for receiving said each one of said plurality of waveguide rod means in respective serrations of said inner edge; and, frame means removably connected to said second coupler for maintaining said each one of said plurality of waveguide rod means in demountable engagement with said respective serrations of said inner edge, whereby alignment of said plurality of waveguide rod means is maintained.

10. The fixture as recited in claim 3 wherein said plurality each one of said of waveguide rod means is positioned to define a circular waveguide section.

11. The fixture as recited in claim 10 wherein said second input port of said second coupler includes:

an inner plate having a serrated inner edge for receiving said each one of said plurality of waveguide rod means in respective serrations of said inner edge; and, frame means removably connected to said second coupler for maintaining said each one of said plurality of waveguide rod means in demountable engagement with said respective serrations of said inner edge, whereby alignment of said plurality of waveguide rod means is maintained.

12. The fixture as recited in claim 10 wherein said first output port of said first coupler includes:

an inner plate having a serrated inner edge for receiving said each one of said plurality of waveguide rod means in respective serrations of said inner edge; and, frame means for maintaining said each one of said plurality of waveguide rod means in engagement with said respective serrations of said inner edge, whereby alignment of said plurality of waveguide rod means is maintained.

13. The fixture as recited in claim 10 wherein said second input port of said second coupler includes a plurality of bores therein for receiving respective ones of said plurality of waveguide rod means in slidable contact with walls of said bores, whereby alignment of said plurality of waveguide rod means is maintained.

14. The fixture as recited in claim 10 wherein said first output port of said first coupler includes a plurality of bores therein for receiving respective ones of said plurality of waveguide rod means in slidable contact with walls of said bores, whereby alignment of said plurality of waveguide rod means is maintained.

* * * * *